United States Patent
Apel

(10) Patent No.: US 7,667,532 B1
(45) Date of Patent: Feb. 23, 2010

(54) BIAS CONTROL SYSTEM FOR A POWER AMPLIFIER

(75) Inventor: Thomas R. Apel, Portland, OR (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 12/368,065

(22) Filed: Feb. 9, 2009

Related U.S. Application Data

(62) Division of application No. 11/283,623, filed on Nov. 21, 2005, now Pat. No. 7,489,183.

(60) Provisional application No. 60/634,889, filed on Dec. 8, 2004.

(51) Int. Cl.
*G05F 1/10* (2006.01)

(52) U.S. Cl. ...................... 327/538; 327/543

(58) Field of Classification Search .......... 327/430, 327/530, 534, 535, 537, 538, 540, 541, 543
See application file for complete search history.

(56) References Cited

U.S. PATENT DOCUMENTS

| | | | |
|---|---|---|---|
| 4,068,140 A | 1/1978 | Lou | |
| 4,300,061 A | 11/1981 | Mihalich et al. | |
| 4,558,235 A * | 12/1985 | White et al. | 326/116 |
| 4,810,905 A * | 3/1989 | Graham et al. | 326/72 |
| 4,918,336 A | 4/1990 | Graham et al. | |
| 5,506,544 A | 4/1996 | Staudinger et al. | |
| 5,587,655 A | 12/1996 | Oyabe et al. | |
| 5,724,004 A | 3/1998 | Reif et al. | |
| 5,903,141 A | 5/1999 | Tailliet | |
| 6,304,130 B1 | 10/2001 | Poulin et al. | |
| 6,496,073 B2 | 12/2002 | Choi | |
| 7,224,230 B2 | 5/2007 | Apel et al. | |
| 7,230,493 B2 | 6/2007 | Kokubo | |

* cited by examiner

*Primary Examiner*—Jeffrey S Zweizig
(74) *Attorney, Agent, or Firm*—Chernoff, Vilhauer, McClung & Stenze

(57) ABSTRACT

A bias control system for the radio frequency power amplifiers that includes a current source, a mirror current, and a bias voltage.

13 Claims, 6 Drawing Sheets

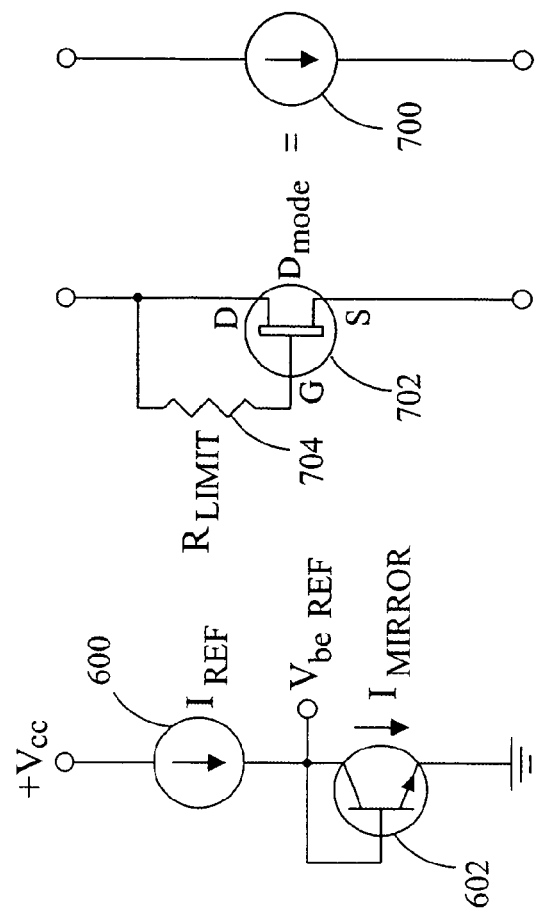
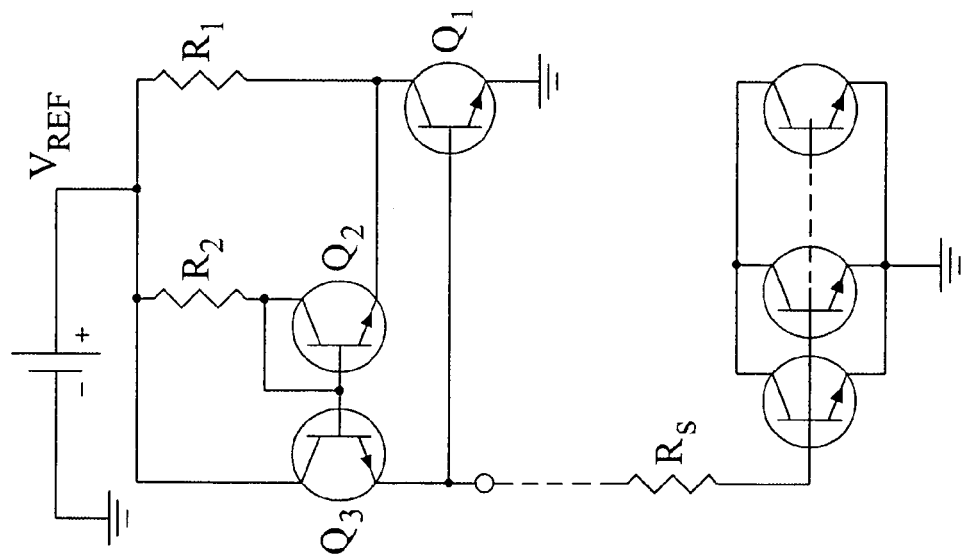
FIG. 7
FIG. 6
FIG. 5

BIAS CONTROL SYSTEM FOR A POWER AMPLIFIER

CROSS-REFERENCE TO RELATED APPLICATIONS

This application is a divisional of pending U.S. Nonprovisional application Ser. No. 11/283,623 filed on Nov. 21, 2005, now U.S. Pat. No. 7,489,183, which claims the benefit of U.S. Provisional Application No. 60/634,889, filed Dec. 8, 2004, both entitled "BIAS CONTROL SYSTEM FOR A POWER AMPLIFIER." The specifications of said previous applications are hereby fully incorporated by reference in their entirety, except for those sections, if any, that are inconsistent with this specification

TECHNICAL FIELD OF THE INVENTION

The present invention relates to radio frequency (RF) power amplifiers, and in particular, to a bias control system for the RF power amplifiers.

BACKGROUND OF THE INVENTION

Radio frequency (RF) power amplifiers are often used in an array of portable applications, such as cellular telephones and wireless network devices. In such applications, the operating voltages are limited to those available from a battery source. Operating voltages tend to decrease as the battery source is discharged. The use of low operating voltages presents performance challenges in the design of RF power amplifiers.

In RF power amplifiers, bias voltage and current provided to the base of amplifying transistor(s) determine the class of operation and the linearity of the RF power amplifier response. Conventional current mirror bias reference circuits that have low output impedance may be used to provide bias voltage and current, but are often more sensitive to variations in the operating voltages. Current mirror reference sensitivity to the operating voltage level is undesirable.

FIG. 1 illustrates one example of a bias reference circuit. A source reference voltage Vref is provided, typically from a battery. The current level through the resistor R1 is essentially determined by (Vref−Vbe)/R1, where Vbe is relatively constant. The current through the transistor Q1 acts to set Vbe where Vbe=Vt*ln(Ie/Is), which is then essentially mirrored in the RF power amplifying transistor to be biased. The RF amplifying transistor to be biased tends to have the same current density as the reference transistor Q1 (both are biased with reference to ground), but because the RF amplifying transistor to be biased is a larger device, it has more current. The current through the resistor R1 (and hence substantially the same as through transistor Q1) is mirrored in the RF amplifying transistor to be biased, to provide the appropriate output signals.

In the case of a heterojunction bipolar transistor (HBT), Vbe tends to be approximately 1.25 volts, and Vref tends to be approximately 2.85 volts. Therefore, a decrease in Vref by 0.1 volts results in a change in the current level of approximately 7%. In many applications, variability in the current level of 7% is not acceptable. A highly regulated voltage Vref may be used to provide suitable control of the bias for the RF amplifying transistor.

FIG. 2 illustrates another bias reference circuit. A source reference voltage Vref is provided, typically from a battery. The current level through the resistor R1 is determined by (Vref−2*Vbe)/R1, where Vbe is relatively constant. The current through the resistor R1 is mirrored in the RF amplifying transistor to be biased, to provide the appropriate output signals.

In the case of a HBT, the Vbe tends to be approximately 1.25 volts (2.5 volts for 2*Vbe), and Vref tends to be approximately 2.85 volts. Therefore, a decrease in Vref by 0.1 volts results in a change in the current level of approximately 40%. In many applications, a variability in the current level of 40% is not acceptable. Again, highly regulated voltage Vref may be used to provide suitable control of the bias for the RF amplifying transistor.

FIGS. 3, 4, and 5 illustrate other bias reference circuits. A source reference voltage Vref is provided, typically from a battery. The current level through the resistor R1 is determined by Vbe and the resistors (R1, R2, R1A, R1B), where Vbe is relatively constant. The current is mirrored in the RF amplifying transistor to be biased, to provide appropriate output signals.

In the case of a HBT, Vbe tends to be approximately 1.25 volts (2.5 volts for 2*Vbe), and Vref tends to be approximately 2.85 volts. Therefore, a decrease in Vref by a small amount results in a significant current level change. Again, a highly regulated voltage Vref may be used to provide suitable control of the bias for the RF amplifying transistor.

BRIEF DESCRIPTION OF THE SEVERAL VIEWS OF THE DRAWINGS

FIG. 5 illustrates another bias reference circuit.
FIG. 6 illustrates a current source and a current mirror.
FIG. 7 illustrates one embodiment of a current source.

DETAILED DESCRIPTION OF PREFERRED EMBODIMENT

Figure 2:
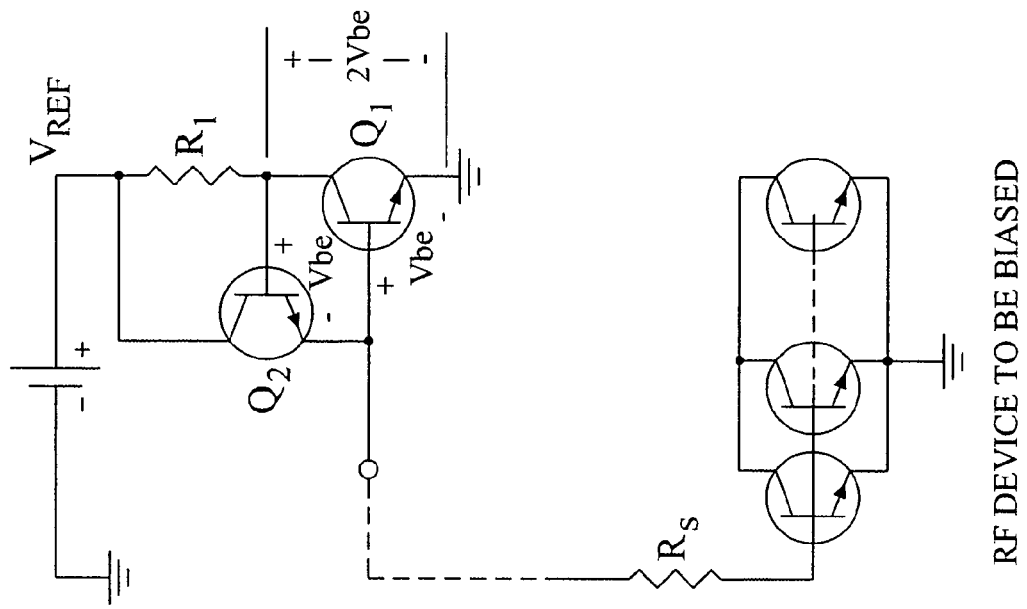
FIG. 2 illustrates another bias reference circuit.
Figure 1:
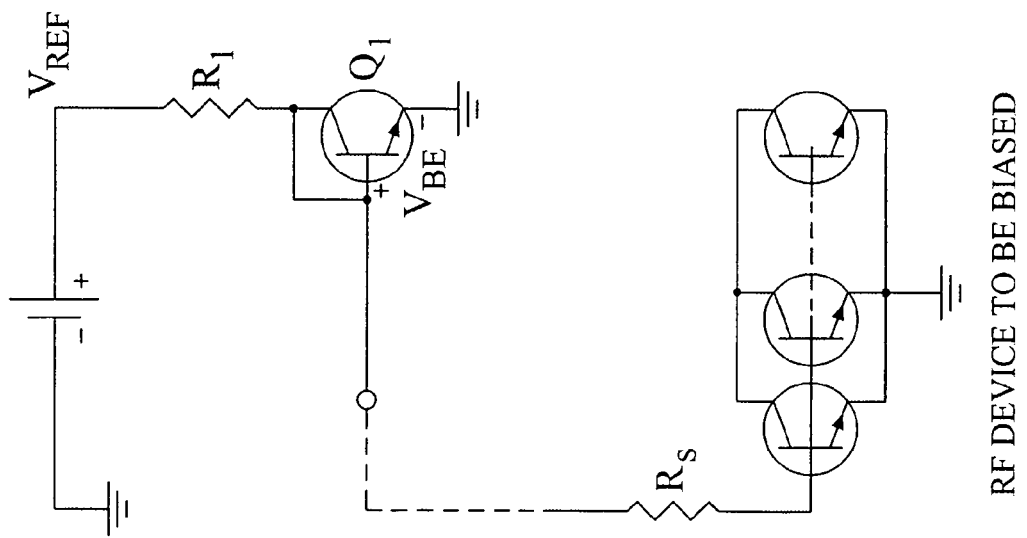
FIG. 1 illustrates a bias reference circuit.
Figure 4:
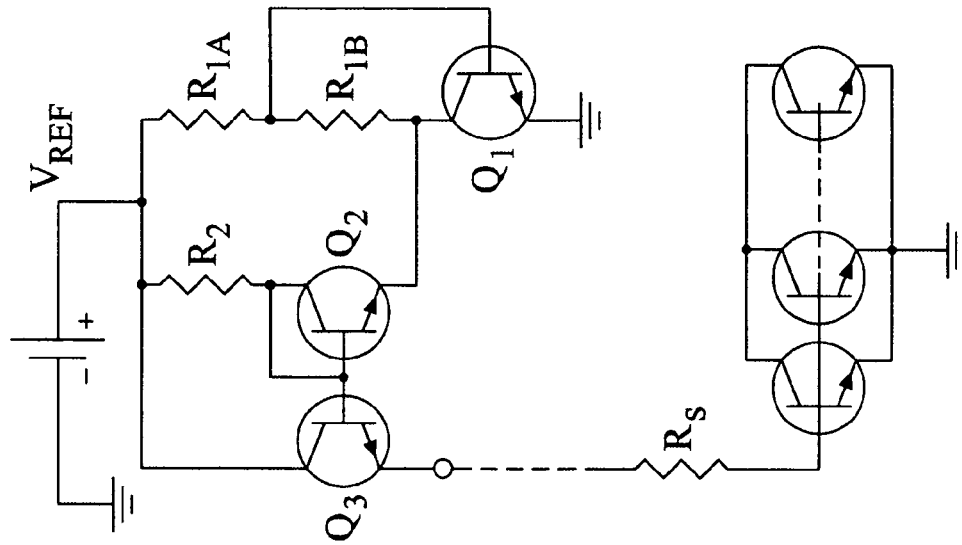
FIG. 4 illustrates another bias reference circuit.
Figure 3:
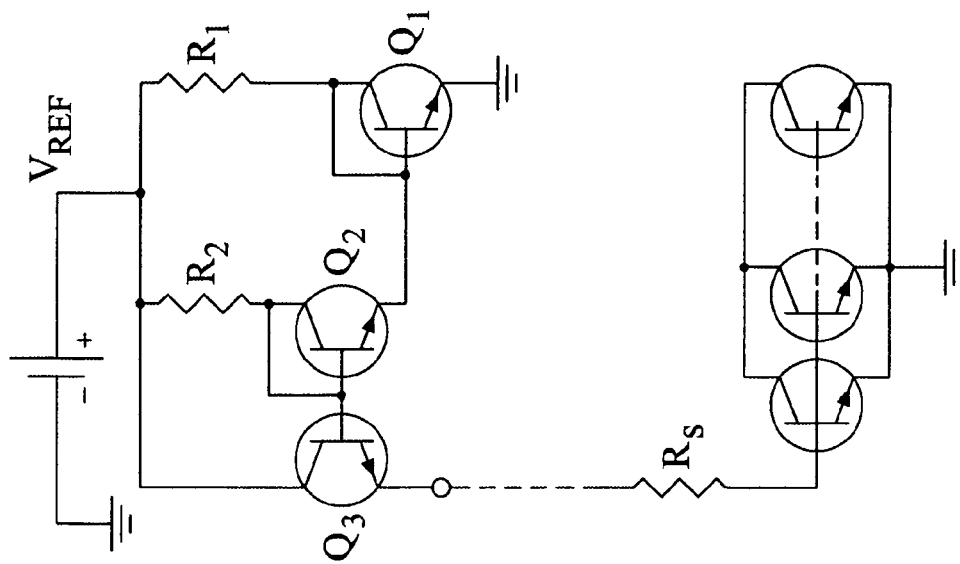
FIG. 3 illustrates another bias reference circuit.

Attempting to design an increasingly complex circuit to reduce the effects of a variable voltage source in the aforementioned bias reference topologies is problematic. In some cases, additional complex circuitry may be provided in association with the battery to regulate the voltage level from the battery. The topology of a bias reference circuit normally results in the current density through a transistor, current through a resistor, or current through another element being mirrored in the RF power amplifier.

Since it is the current density that is mirrored when a transistor is used to set the bias current, a current source may be used to set the bias current that is then mirrored in the RF power amplifier. The use of a current source to set the bias current significantly reduces the dependency on the reference voltage, and accordingly variations in the voltage level will have minimal impact on the bias current.

FIG. 6 illustrates a current source and a current mirror. Current source 600 may be used to generate Iref, which is substantially independent of the source voltage (such as the voltage from a battery) and the voltage Vbe across transistor 602. Imirror through transistor 602 is substantially equal to Iref. The voltage Vbe REF is set by voltage Vbe of transistor 602, which is primarily determined by the current density associated with Imirror.

FIG. 7 illustrates one embodiment of a current source. Current source 700 includes pHEMT transistor 702 with its drain connected to its gate through resistor 704. In one embodiment, pHEMT transistor 702 is a depletion mode (D-mode) pHEMT transistor. In an alternative embodiment, pHEMT transistor 702 is an enhancement mode (E-mode) pHEMT transistor.

It is noted that the drain current Imax of pHEMT transistor 702 in the depletion mode tends to be well behaved and repeatable. The current level is set by the geometry of pHEMT transistor 702, which can be accurately controlled during the fabrication process. When pHEMT transistor 702 is a D-mode pHEMT transistor, resistor 704 in the configuration illustrated in FIG. 7 acts to forward bias pHEMT transistor 702 (i.e., forward biased mode), which is preferable because the Imax is more tightly distributed than the source current, for example. Other currents sources may likewise be used, as desired.

Figure 8:
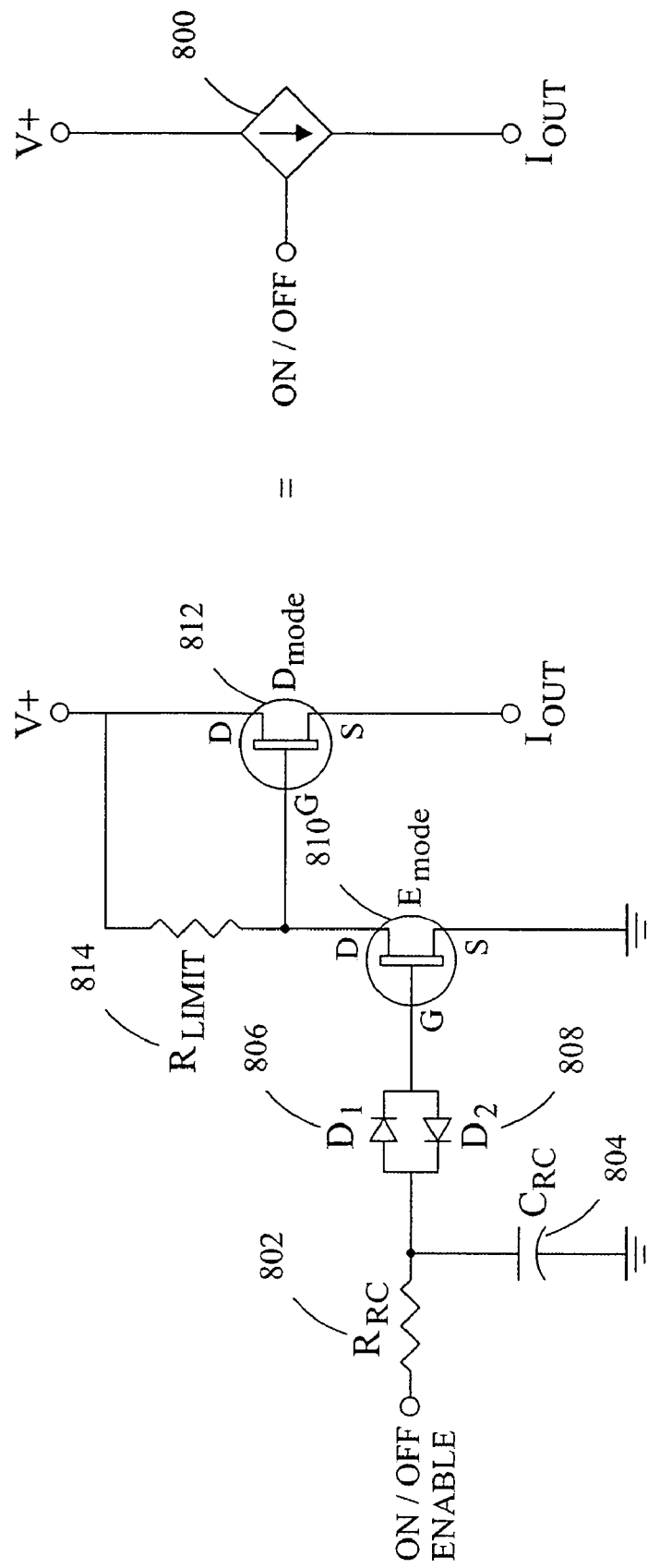
FIG. 8 illustrates one embodiment of a current source with an enable.

FIG. 8 illustrates one embodiment of a current source with an enable. In current source 800, an enable signal may be provided from a device such as a cellular phone logic controller (not shown). Resistor Rrc 802 and capacitor Crc 804 provide RC filtering. Diode D1 806 is provided for a level shift of the enable voltage to the gate of E-mode transistor 810. Diode D2 808 is provided so that when the enable voltage is low the charge on the gate of E-mode transistor 810 is pulled down. The voltage provided by the enable signal results in either a significant voltage being imposed on the gate of E-mode transistor 810 or an insignificant voltage being imposed on the gate of the Emode transistor.

When an insignificant voltage (such as zero volts) is imposed on the gate of E-mode transistor 810, E-mode transistor 810 is "open" circuited, and the voltage imposed at the drain of E-mode transistor 810 is high (from the voltage source). The gate of D-mode transistor 812 has the same voltage as the drain of E-mode transistor 810, and thus is likewise high. A high voltage on the gate of D-mode transistor 812 results in D-mode transistor 812 providing a substantially constant bias current. The size of D-mode transistor 812 sets the level of the current being provided.

When a significant voltage (such as 3 volts) is imposed on the gate of E-mode transistor 810, E-mode transistor 810 is "on," and the voltage imposed at the drain of E-mode transistor 810 is low. The gate of the D-mode transistor 812 has the same voltage as the drain of E-mode transistor 810, and thus is likewise low. Resistor Rlimit 814 acts to limit the current levels. A low voltage on the gate of D-mode transistor 812 results in D-mode transistor 812 being effectively off. Thus, no significant current is drained from the battery through D-mode transistor 812. A small current flows through RLIMIT. Preferably the off current, which is primarily passing from the battery through E-mode transistor 810, is less than 100 or 200 uA.

The topology illustrated in FIG. 8 enables D-mode transistor 812 when a low voltage is provided (e.g., 0 volts) and disables D-mode transistor 812 when a logic high voltage is provided (e.g., >2.5 volts). Thus, current source 800 includes an enable and disable capability without turning off and on the voltage from a voltage source, and the enable and disable capability is a high-side switch. Consequently, power from a voltage source such as a battery is not substantially drained when an RF power amplifier that includes current source 800 is not being used. If the source of the enable signal uses a logic high for enable and a logic low for disabled, an inverter may be included to change the voltage levels.

Figure 9:
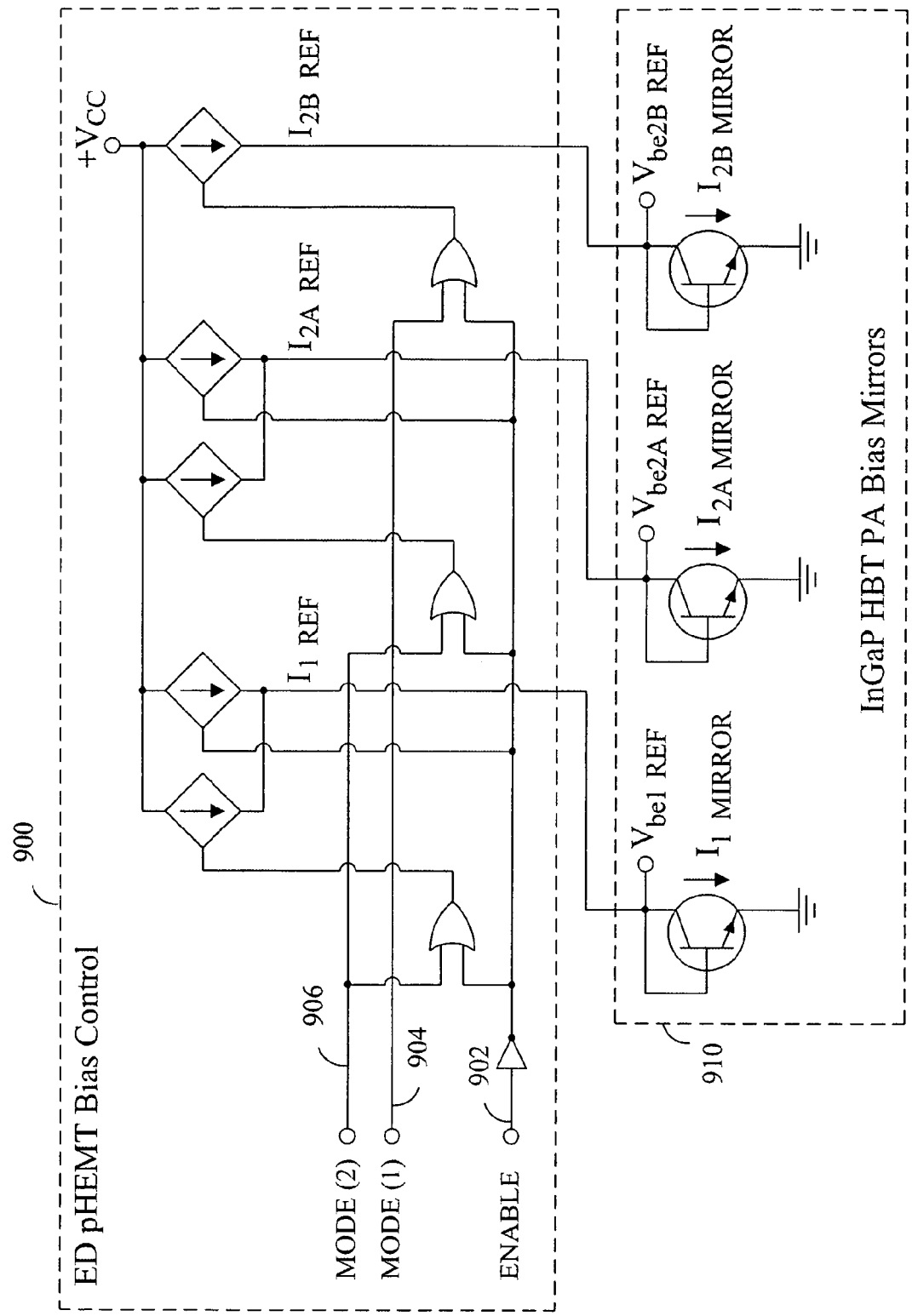
FIG. 9 illustrates one embodiment of a three-stage current source, with control logic and bias mirrors.

FIG. 9 illustrates one embodiment of a three-stage current source, with control logic and bias mirrors. Bias control circuitry 900 may be fabricated using any suitable fabrication process. One fabrication process is pHEMT (GaAs technology). The pHEMT process includes field effect transistors which provide the logic control. Bias control circuitry 900 may also be readily fabricated using CMOS technology.

Bias control circuitry 900 includes enable line 902, a pair of mode controls, namely, mode (1) 904 and mode (2) 906, and a DC power connection (not shown). Mode (1) 904 and mode (2) 906 control whether amplifier stages receive a reference current, and the level of the reference currents received.

RF power amplifier bias mirrors 910 are preferably fabricated using indium gallium phosphide HBTs or MESFET (GaAs technology). The indium gallium phosphide heterojunction bipolar transistor process includes only NPN type transistors.

Figure 10:
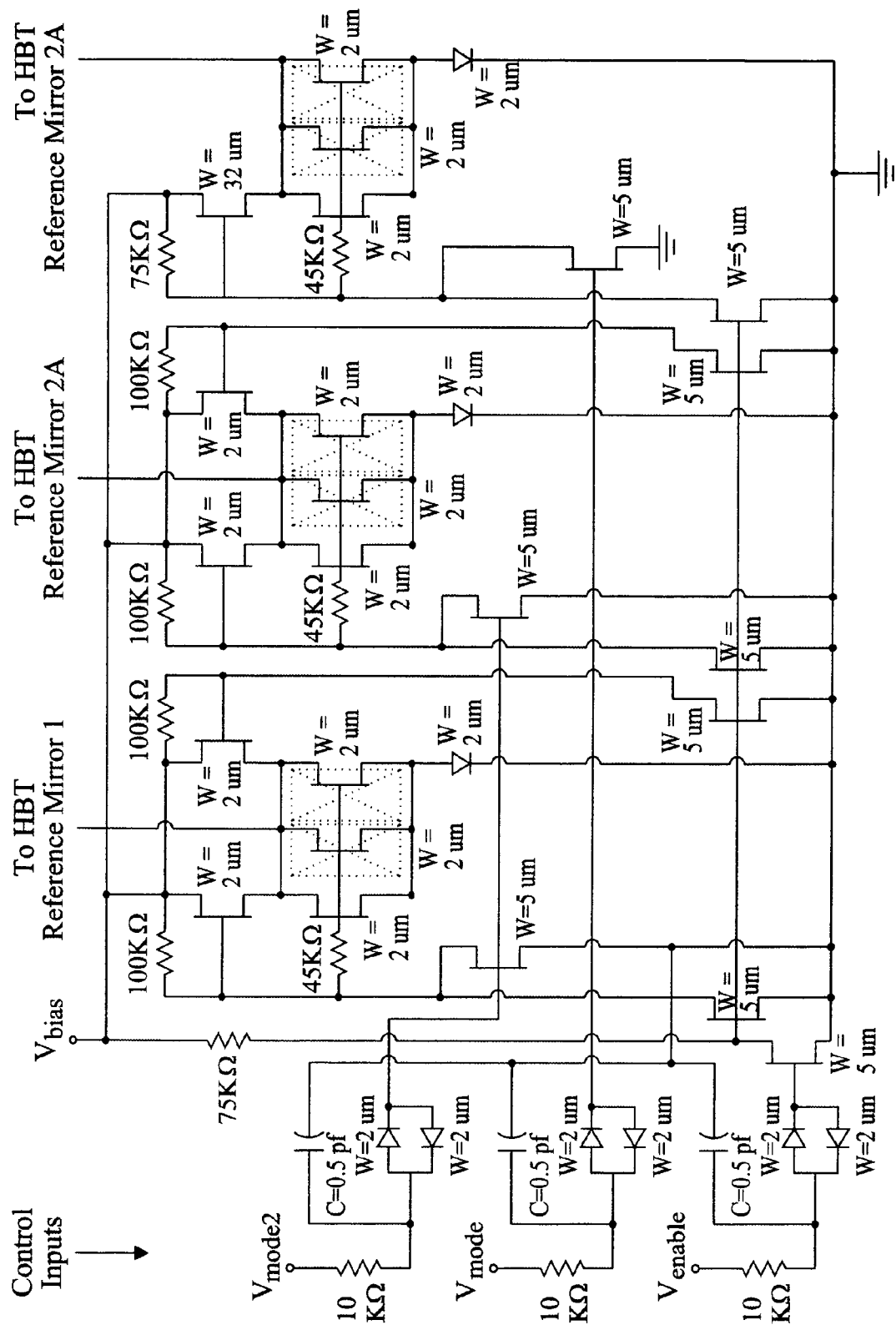
FIG. 10 illustrates one embodiment of a circuit having current sources and bias control logic.

FIG. 10 illustrates one embodiment of a circuit having current sources and bias control logic. FIG. 10 includes exemplary values for different circuit components. It is noted that the system may include a current source with a single current mirror that includes a single transistor, a current source that includes a pair of current mirrors using a pair of transistors normally fabricated using different processes, or otherwise any suitable configuration.

While FIG. 10 illustrate one particular configuration, the current source may likewise be incorporated with any RF power amplifier bias circuit, such as those shown in FIGS. 1 to 5. In addition, the mirror circuit and RF amplifier technology are not restricted to bipolar transistors. It is also noted that with the current source configuration, a change in the reference voltage of 0.1 volts results in a change on the current level of less than 5%, and more preferably less than 2%. Also, with the current source configuration, a change in the reference voltage (e.g., battery voltage level) from a range of 3.5 to 4.0 volts results in a change in the current level at a quiescent level of less than 10%, and more preferably less than 5%.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A circuit providing a bias voltage comprising:
   a current source providing a reference current that is substantially independent of the voltage of a power source for said current source, wherein said current source includes a depletion mode transistor fabricated using a pHEMT process, and a gate of said transistor and a drain of said transistor are interconnected by a resistor, wherein said current source is selectively enabled and disabled; and
   a mirror current which has a magnitude determined based upon said reference current from said current source;
   said bias voltage determined for a power amplifier based upon said mirror current.

2. The circuit of claim 1, wherein said current source is selectively enabled and disabled free from modification of the power to said current source.

3. The circuit of claim 1, wherein said circuit has a leakage current of less than 250 μA when said current source is said disabled.

4. The circuit of claim 3, wherein said leakage current is less than 100 μA.

5. The circuit of claim 3, wherein said current source is fabricated using GaAs.

6. The circuit of claim 4, wherein said current source is fabricated using GaAs.

7. The circuit of claim 1, wherein said current source includes a transistor, and a switching transistor interconnected to said transistor to selectively enable and disable.

8. The circuit of claim 7, wherein said switching transistor and said transistor are fabricated using GaAs.

9. The circuit of claim 8, wherein said switch transistor and said transistor are fabricated using the same process.

10. The circuit of claim 7, wherein said switching transistor operates in an enhancement mode.

11. The circuit of claim 10, wherein said transistor operates in a depletion mode.

12. The circuit of claim 7, wherein an enable signal is provided to said switching transistor.

13. The circuit of claim 12, wherein a pair of diodes is interconnected to the gate of said switching transistor.

* * * * *